United States Patent [19]

Wilting

[11] 4,080,719
[45] Mar. 28, 1978

[54] METHOD OF MANUFACTURING A SEMICONDUCTOR DEVICE AND DEVICE MANUFACTURED ACCORDING TO THE METHOD

[75] Inventor: Hermanus Josephus H. Wilting, Eindhoven, Netherlands

[73] Assignee: U.S. Philips Corporation, New York, N.Y.

[21] Appl. No.: 721,661

[22] Filed: Sep. 9, 1976

[30] Foreign Application Priority Data

Sep. 17, 1975 Netherlands .......................... 7510903

[51] Int. Cl.² .............................................. B01J 17/00
[52] U.S. Cl. ........................................ 29/571; 29/578; 357/59
[58] Field of Search ..................... 29/571, 578; 357/59

[56] References Cited

U.S. PATENT DOCUMENTS

| | | | |
|---|---|---|---|
| 3,699,646 | 10/1972 | Vadasz | 29/571 |
| 3,745,647 | 7/1973 | Boleky | 29/571 |
| 3,761,327 | 9/1973 | Harlow | 357/59 |
| 3,777,364 | 12/1973 | Schinella | 29/578 |
| 3,958,323 | 5/1976 | De La Moneda | 29/571 |

*Primary Examiner*—W. Tupman
*Attorney, Agent, or Firm*—Frank R. Trifari

[57] ABSTRACT

A method of manufacturing a metal silicide pattern with respect to which two electrode zones are to be provided in a self-registering manner. According to the invention the pattern is provided in the form of a layer of polycrystalline silicon and, by selective oxidation and masking, only the upper surface of the pattern is exposed to the silicide formation so that passivation problems and short circuit are avoided. The use of silicides which cannot withstand high temperatures is also possible.

14 Claims, 16 Drawing Figures

METHOD OF MANUFACTURING A SEMICONDUCTOR DEVICE AND DEVICE MANUFACTURED ACCORDING TO THE METHOD

The invention relates to a method of manufacturing a semiconductor device in which a surface of a semiconductor body is provided with an electrically insulating layer and a silicon layer, which is given a desired pattern, is provided on the insulating layer, after which the semiconductor surface is provided with at least two electrode zones by the supply of material from the environment while using at least a part of the pattern as a mask.

The invention relates moreover to a semiconductor device manufactured according to the method.

A method as described above is known and is used in particular for the manufacture of insulated gate field effect transistors, see for example IEEE Spectrum, vol. 6, October 1969, pp. 28–35.

Silicon, and notably polycrystalline silicon, is often used in semiconductor technology as a gate electrode for insulated gate field effect devices, but is also at the same time used as a connection conductor. Although technologically this has important advantages, the comparatively high resistivity of polycrystalline silicon is an important drawback in many cases. This may be mitigated partly by giving the silicon a high doping. However, a limit is imposed upon the conductivity to be reached therewith by the restricted solubility of the doping material in silicon and in many cases a sufficiently high conductivity is consequently not achieved.

It has been tried (see, for example, IBM Technical Disclosure Bulletin, vol. 17, No. 6, November 1974, pp. 1831–1833) to solve this problem by reacting the silicon at elevated temperature with a metal, for example Pt, Pd, Co or Ni, as a result of which the silicon is fully or partly converted into a metal silicide. In general said metal silicides have a very good conductivity.

However, a drawback of such silicide systems is that they usually cannot withstand high temperatures, or withstand high temperatures poorly. As a result of this they are often difficult to use in the usual processes. When, for example, in an integrated circuit having MOS transistors, gate electrodes of a metal silicide have to be used, these will not be used or will be used with difficulty as a mask for the self-registering provision of the source and drain electrodes if at least said source and drain electrodes are obtained at high temperature, for example, by diffusion. Although in that case it can be tried to postpone the silicide formation to a later instant so that afterwards no treatment at high temperature is necessary, the silicon should then be exposed prior to the provision of the metal. In this case, however, the protective layers present on the already provided semiconductor zones will in general also be removed, which may give rise to shortcircuits or other complications.

It is an object of the invention to avoid or at least considerably reduce the above-mentioned difficulties.

Another object of the invention is to provide a method by which a very readily conducting pattern can be obtained of which at least a part may be used as a gate electrode in self-registration with the source and drain electrodes.

Still another object of the invention is to provide a method of manufacturing a metal silicide pattern without it being necessary to remove passivating layers formed already previously.

Still a further object of the invention is to provide a method of manufacturing insulated gate field effect transistors, which transistors, due to their small dimensions, are suitable for use at very high frequencies.

The invention is inter alia based on the recognition that this can be achieved by coating a part of the silicon pattern during a part of the process with a layer protecting against oxidation and also against a material-removing treatment.

According to the invention, a method of the kind mentioned in the preamble is therefore characterized in that, after providing the silicon layer, there is provided thereon a masking layer corresponding with the said pattern, which masking layer protects locally against removal of material and against oxidation, after which the parts of the silicon layer not present below the masking layer are removed. least the exposed edges of the resulting silicon pattern are then subjected to an oxidation treatment, after which only the upper surface of the silicon pattern is exposed by selective removal of the masking layer. A metal is then provided on the surface, after which the assembly is subjected to a temperature treatment as a result of which at least a part of the silicon pattern is converted into a metal silicide by reaction with the metal, and the non-converted metal is then removed.

The method according to the invention enables the metal silicide formation to be postponed to an instant as late as possible, that is to say to after or simultaneously with the formation of the electrode zones, without it being necessary to remove previously passivating layers that already exist. This is possible in that in the method according to the invention only the upper surface of the silicon pattern is exposed to the silicide formation. Since furthermore the silicon pattern is, prior to, or at the latest during, the formation of the metal silicide as a mask for providing the electrode zones, no high temperatures need be used after the silicide formation so that metal silicides which can very poorly withstand high temperatures, may also be used.

An important further advantage of the possibility of using a metal silicide as a gate electrode is that the thickness of the silicide pattern, due to the very much better conductivity, may be much smaller than when using polycrystalline silicon, even if this matter is highly doped. As a result of this, the delevelling of the surface on which the ultimate metallization is to be provided, can also be much smaller.

The method is of particular importance for the manufacture of insulated gate field effect transistors as will be described hereinafter.

The invention will now be described in greater detail with reference to a few examples and the drawing, in which.

The Figures are diagrammatic cross-sectional views and are not drawn to scale. Corresponding parts are generally referred to by the same reference numerals. In so far as the semiconductor zones are shaded, regions of the same conductivity type are shaded in the same direction.

Figure 1:
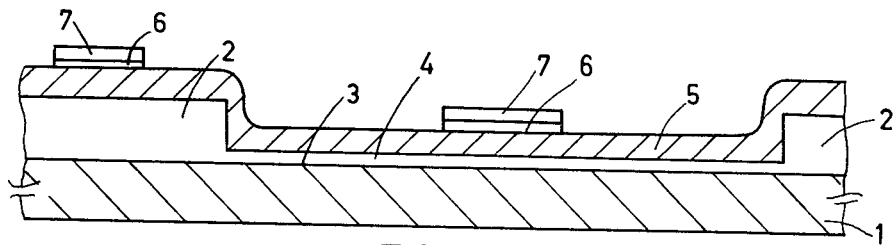
FIGS. 1 to 6 show successive stages in the manufacture of a semiconductor device according to the invention.

FIGS. 1 to 6 are diagrammatic cross-sectional views of the manufacture of a semiconductor device by using the method according to the invention. Starting material (see FIG. 1) is a semiconductor body 1, in this Example a silicon plate 1 which in this case is chosen to be $n$ conductive, but this is not necessary and the operation may be carried out analogously on a p-type plate. The plate has a resistivity of, for example, 1 Ohm.cm. On the plate (see FIG. 1) an approximately 1 micron thick layer 2 of silicon oxide is provided by using known methods, for example, pyrolytic deposition, in which layer an aperture is etched in which aperture a field effect transistor will be provided. Within the aperture the surface 3 of the silicon plate is covered with an electrically insulating layer 4, for example also of silicon oxide, approximately 0.1 micron thick and obtained, for example, by thermal oxidation. A polycrystalline silicon layer 5, for example, 0.2 micron thick, is deposited in the usual manner, for example, by decomposition of a gaseous silicon compound, on said insulating layer 4 and also on the thicker oxide layer 2. According to the invention, in a manner generally used in semiconductor technology, a thin, for example 0.05 micron thick silicon oxide layer 6 is provided across the layer 5 and then an approximately 0.1 micron thick layer 7 of silicon nitride is provided. For example, via photolithographic etching methods conventionally used in semiconductor technology, the layers 6 and 7 are then given a certain pattern, in which a layer of photolacquer (not shown) may be used as a mask, phosphoric acid may be used as an etchant for the silicon nitride at approximately 150° C, and a hydrofluoric acid-containing solution may be used as an etchant for the silicon oxide. For details as regards the provision, masking and etching of oxide layers and nitride layers, reference is made to Appels et al., Philips Research Reports, April 1970, pp. 118–132.

After removing the photolacquer the configuration shown in FIG. 1 is obtained.

Figure 2:
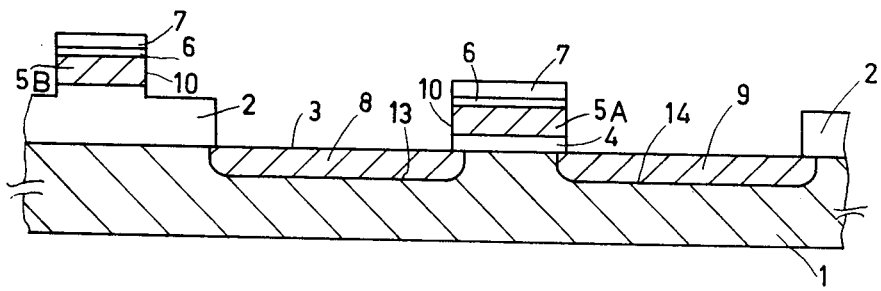
Figure 3:
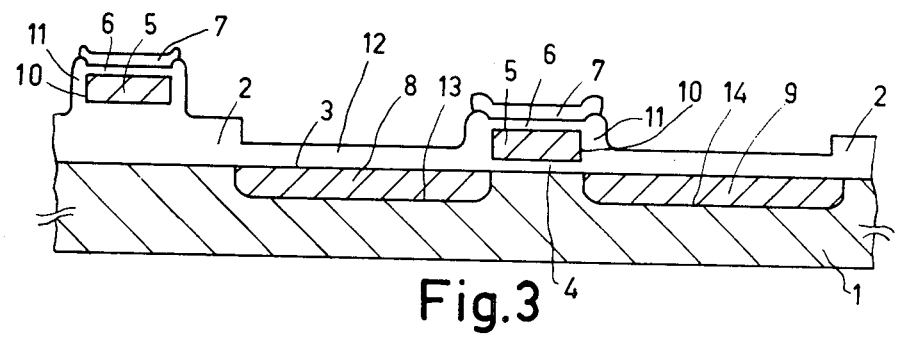
Figure 4:
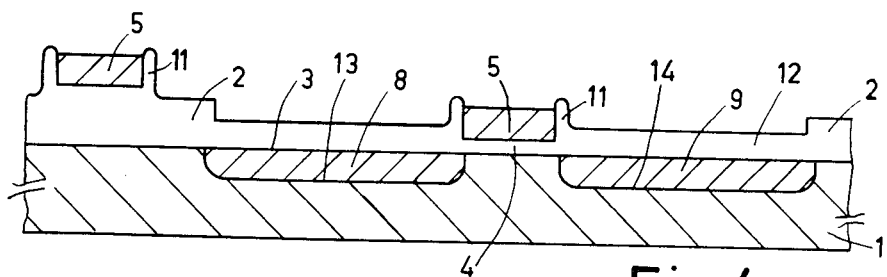
Figure 5:
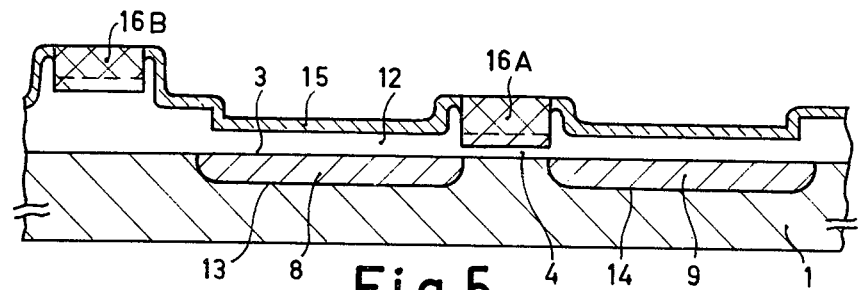

The polycrystalline silicon layer 5 is then etched away by means of a known etchant which contains, for example, hydrofluoric acid and nitric acid. The composite layer (6, 7) serves as a mask so that only the parts of the layer 5 not covered by the composite layer are removed. A certain extent of underetching occurs, which, however, is of no significance for the invention and is not shown in the Figures for reasons of clarity. In this manner the silicon pattern 5A, B of FIG. 2 is obtained in which the part A of the resulting pattern will form the gate electrode of a field effect transistor, while part B is a cross-section of an interconnection conductor formed by the pattern.

In this Example according to the invention, the parts of the insulating layer 4 not present below the polycrystalline silicon pattern are then removed, after which an acceptor, for example, boron, is introduced into the semiconductor body, for example, by diffusion from the environment (the atmosphere or a solid diffusion service) to form p-type electrode zones 8 and 9 while using the part 5A of the silicon pattern with the layers 6 and 7 present thereon as a mask. Thus, the structure shown in FIG. 2 is obtained. If the zones 8 and 9 are not formed by diffusion but, for example, by ion implantation, the implantation may be carried out, if desired, through the insulating layer 4 in which case the layer 4 need not be removed.

The assembly is then subjected to an oxidation treatment, for example by heating in moist nitrogen for approximately 1 hour at 1000° C. As a result of this the exposed edges 10 of the pattern are covered with a 0.5 micron thick oxide layer or oxide wall 11, see FIG. 3. During said oxidation treatment the electrode zones 8 and 9 are simultaneously covered with a 0.5 micron thick oxide layer 12. The layer 12, however, may also be formed during the provision of the zones 8 and 9 in an oxidizing atmosphere.

According to the invention, the masking layer (6, 7) is now removed selectively by etching, the layers 7 and 6 being etched away in successive etching steps. Since the oxide layer 6 is very thin, the layers 2, 11 and 12 are etched away only partly even without masking, see FIG. 4. Therefore, only the upper surface of the silicon pattern 5A, B is exposed, which is essential for the invention.

A metal, in this example a platinum layer 15, is then provided over the whole surface in a thickness of, for example, 0.1 micron, after which the double-shaded part 16 which is bounded by the broken line (see FIG. 5) is converted into platinum silicide by heating at 500° C for 15 minutes in an inert or reducing atmosphere. The thickness of the conductor pattern is increased, which is shown diagrammatically in the drawing. In this example the metal layer 15 on top of the polycrystalline silicon is converted entirely into silicide; however, in particular when using another metal, it may occur that a thick non-converted metal layer remains on the silicide 16.

The non-converted platinum 15 is now removed by etching in, for example, aqua regia. The resulting platinum silicide pattern 16 has been manufactured by using the method according to the invention without it being necessary therefor to remove the oxide walls 11 and the passivating layer 12, so that no danger of contamination and hence deterioration of the properties of the p-n junctions 13 and 14 exists.

Figure 6:
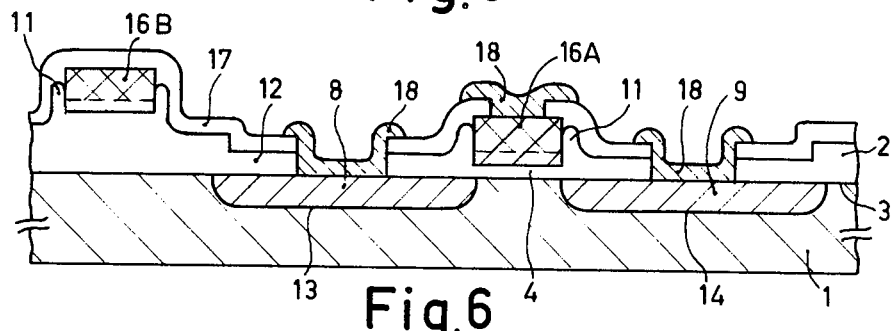

The device comprising an insulating gate field effect transistor the zones 8 and 9 of which constitute the source and drain zones, and the part 16A of the platinum silicide pattern (together with the non-converted part of the polycrystalline silicon) which constitutes the gate electrode, and another part 16B of which constitutes an interconnection conductor, is now completed by providing over the assembly, including the metal silicide pattern, a protective electrically insulating layer 17 of pyrolitic silicon oxide, thickness 1 micron, etching therein contact windows in the usual manner, and finally providing a metallization pattern 18, preferably aluminium (see FIG. 6). The part 16B of the metal silicide pattern may serve in the usual manner as a through-connection between various elements of the integrated circuit (not shown in the Figure) and may, if desired, constitute the first layer of a multi-layer wiring pattern. If necessary, the part 16B can be contacted via a contact window in the layer 17.

The resulting device now comprises a very readily conducting platinum silicide pattern which need not be further subjected to high temperatures, since the zones 8 and 9 were already formed prior to the metal silicide.

The overall thickness of the silicide pattern is now only approximately 0.3 micron. Due to the good conductivity of metal silicides this may be even smaller, if desired. The delevelling of the surface on which the ultimate metallization 18 is provided may therefore be smaller than when using polycrystalline silicon as a conductor pattern, which pattern, in order to obtain acceptable series resistances, should in general have a thickness of at least 0.5 microns.

Figure 7:
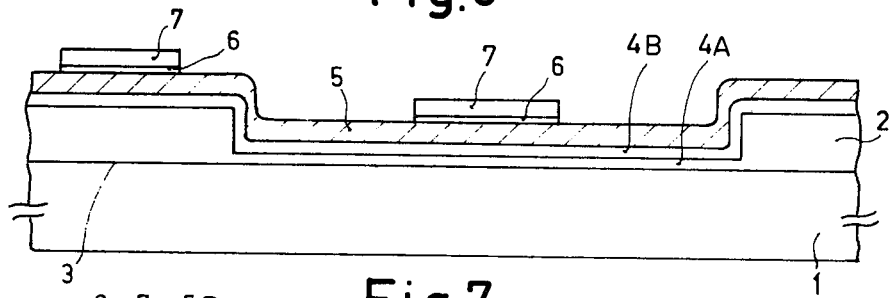
FIGS. 7 to 13 show the manufacture of another semiconductor device according to a modified embodiment of the method.
Figure 8:
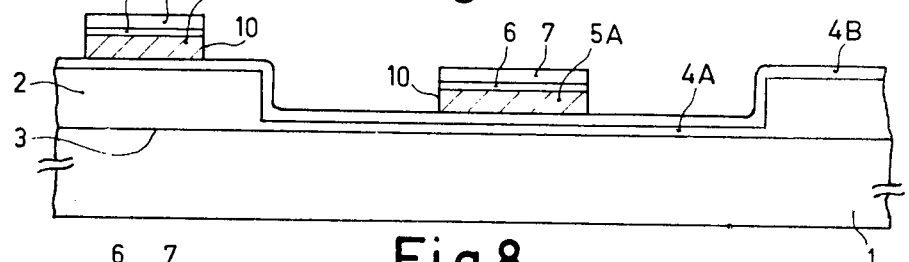
Figure 9:
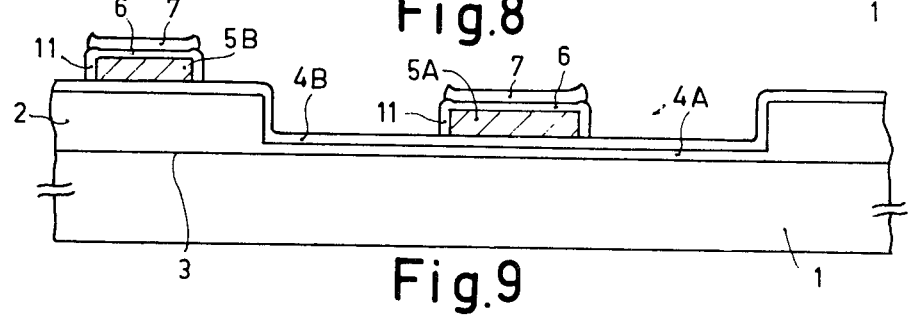
Figure 10:
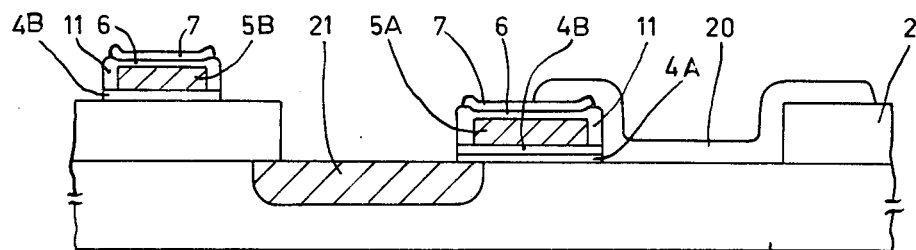

FIGS. 7 to 13 show another Example of the use of the method according to the invention, namely the manufacture of a so-called D-MOST, sometimes referred to as DSA (Diffused Self Aligned) MOS transistor, in which, in addition to the source and drain electrode zones, also at least a part of the channel region is obtained by doping, preferably by diffusion. Starting material is a silicon plate 1 having a comparatively high resistivity, for example 20 to 30 Ohm.cm, which in this Example may be both n-type conductive and p-type conductive. As in the first Example, a thick layer, for example a 1 micron thick layer 2 of silicon oxide, is provided hereon in which a window is etched for the manufacture of a field effect transistor. The layer 2 may be provided pyrolytically and, as shown in FIG. 7, be present on the surface 3. However, the layer 2 may also be obtained by local thermal oxidation and then be sunk entirely or partly in the silicon, as described in the above-mentioned article by Appels in Philips Research Reports.

An electrically insulating layer 4 is now provided again over the assembly but in this case it is a composite layer which consists of a layer 4A of silicon oxide, approximately 0.07 micron thick, and a layer 4B of silicon nitride present thereon and having a thickness of approximately 0.04 micron. A layer 5 of polycrystalline silicon is then deposited on the nitride layer 4B in a thickness of, for example, 0.2 micron, and a masking layer consisting of a thin, approximately 0.05 micron thick layer 6 of silicon oxide and a thicker, approximately 0.1 micron thick layer 7 of silicon nitride which, as in the preceding Example, is patterned by masking and etching, is then provided thereon. By means of the composite masking layer (6, 7) the polycrystalline silicon 5 is given a pattern by etching, a part 5A of which will constitute the gate electrode of a field effect transistor, while a part 5B belongs to the interconnection pattern see FIG. 8.

The exposed edges 10 of the silicon pattern 5A, B are then oxidized by thermal oxidation in moist nitrogen for 1 hour at 1000° C, said edges being covered with a layer 11 of silicon oxide, approximately 0.5 micron thick. The remaining parts of the structure are not oxidized as a result of the presence of the silicon nitride layers 4B and 7, see FIG. 9.

By means of an etching process with phosphoric acid at a temperature of approximately 150° C, the nitride layer 4B is now removed without using a mask. Although the nitride layer 7 is of course also attacked, a sufficient thickness thereof is nevertheless maintained due to the larger thickness of the layer 7. The oxide layer 4A is then removed, see FIG. 10, by an etching liquid containing hydrofluoric acid, the oxide wall 11 being also etched away only partly due to its larger thickness.

By a pyrolytically provided mask 20 of silicon oxide which can be provided with large tolerance, the exposed silicon surface is covered on one side of the pattern part 5A, after which on the other side of the pattern 5A a p-type zone 21 is diffused, for example by diffusion of boron, to form at least a part of the channel region of the field effect transistor. The mask 20 is then removed and a donor, for example phosphorus, is indiffused on both sides of the pattern part 5A so as to form the n-type zones 22 and 23 which constitute source and drain zones of the transistor. So the pattern 5A is used as a diffusion mask for both diffusions. The zone 21 diffuses during the formation of the zones 22 and 23 deeper in the semiconductor body, while an oxide layer or glass layer 24 is formed on the semiconductor surface. However, said oxide layer 24 may also be formed differently, for example, by first removing oxide from the surface and then providing the surface again with a new oxide layer by thermal oxidation.

Figure 11:
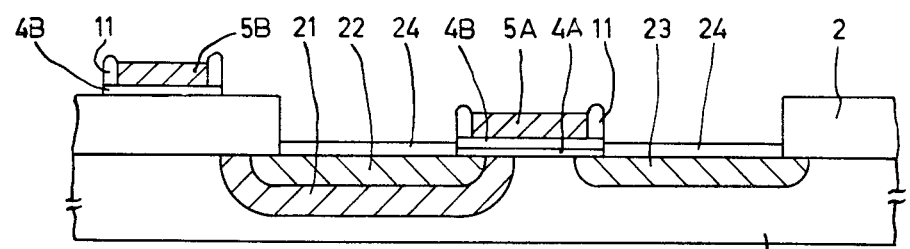
Figure 12:
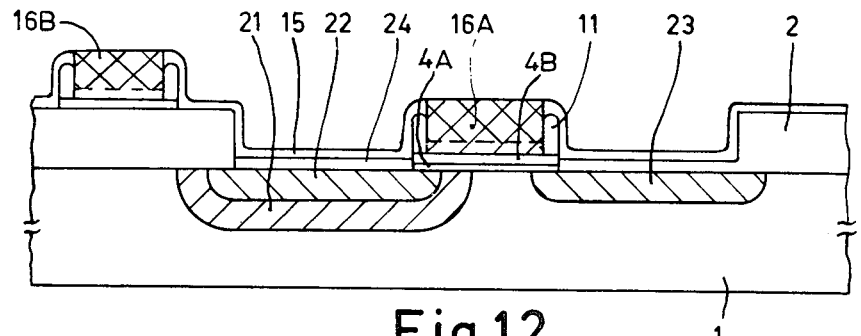
Figure 13:
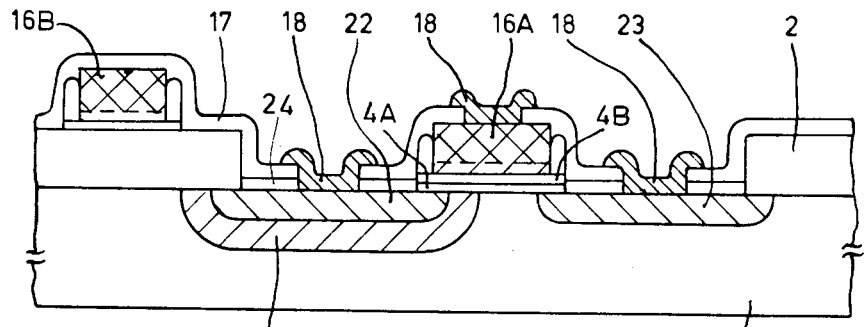

The layers 6 and 7 are then removed by etching as a result of which, as in the previous embodiment, only the upper surface of the polycrystalline silicon is exposed. The oxide layers 2, 11 and 24 actually are so thick that during the etching away of the very thin oxide layer 6 they only are removed for a small part, which is the situation when the etching is carried out without a mask. The resulting structure is shown in FIG. 11.

A metal layer 15 (see FIG. 12) is then provided over the whole surface, for example, by vapour deposition. In this Example again a platinum layer is chosen, its thickness being, e.g., 0.1 micron. Heating at 500° C for 15 minutes is then carried out in an inert or reducing atmosphere, the part 16 of the polycrystalline silicon pattern being converted into platinum silicide. Although in FIG. 12, as in FIG. 5 of the preceding Example, the polycrystalline silicon is converted only for a part, the whole silicon pattern can also be converted by choosing the platinum layer to be thicker.

In this case, also, there is formed a metal silicide pattern having excellent electric conductivity, of which a part 16A is used as a gate electrode and another part 16B is used as a part of an interconnection pattern.

After removing the non-converted platinum 15 in aqua regia, a silicon oxide layer 17 is provided pyrolytically as in the preceding Example (see FIG. 13), after which contact windows are etched through the layers 13 and 24 and an aluminium metallization 18 is provided in the usual manner.

In this manner a device is obtained having a field effect transistor the zones 22 and 23 of which belong to the source and drain zones while the gate electrode 16A consists at least partly of platinum silicide.

As regards the channel region, if the starting material was a p-type silicon plate 1, this consists of the parts of the p-type zones 21 and of the p-type substrate 1, present between the n-type zones 22 and 23. In this case the channel region can simply be contacted via a contact on the substrate 1, for example, on the lower side thereof.

If, however, the starting material was an n-type plate 1 the drain zone, if the n-type zone 22 is used as a source zone, consists of the n-type zone 23 and of the part of the n-type substrate 1 present between the p-type zone 21 and the n-type zone 23, while the channel region is formed by the part of the p-type zone 21 present between the n-type zones 22 and 23. In that case it is slightly more difficult to contact the channel region. If desired, this may be done, for example, by means of a p-type connection zone which is connected to the zone 21, or in a different manner.

In this Example also a readily conductive metal silicide pattern was provided without it being necessary to remove passivating layers already formed previously and without it being necessary to subject the metal silicide to high temperatures.

Although in this Example the zones 21, 22 and 23 were provided by diffusion, this may be done differently entirely or partly, for example, by ion implantation.

Figure 14:
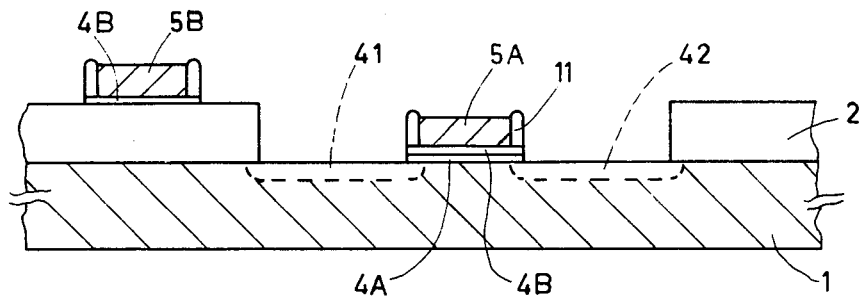
FIGS. 14 to 16 show the manufacture of a third semiconductor device according to a further modified embodiment of the method.
Figure 15:
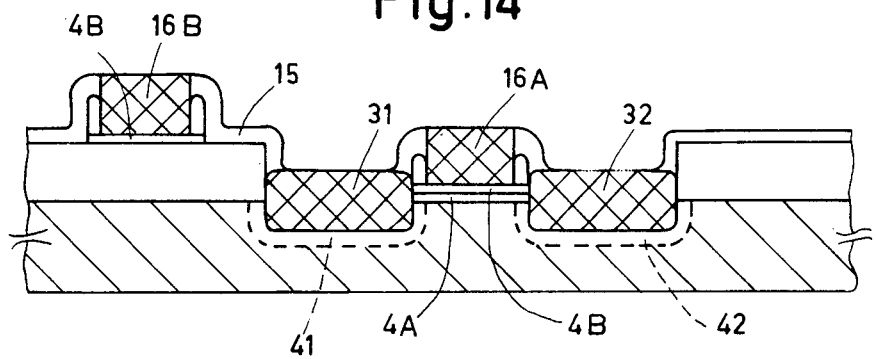
Figure 16:
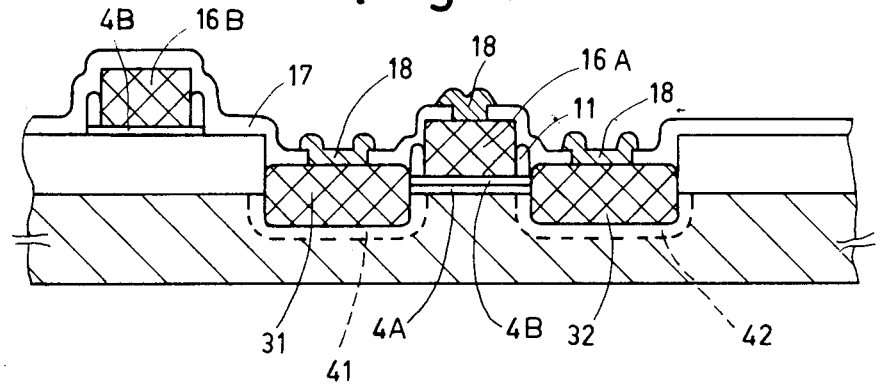

A further important advantage of the method according to the invention will now be illustrated with reference to the following Example (see FIGS. 14 to 16). In this Example also a semiconductor device having an insulated gate field effect transistor is manufactured and the first steps of the manufacture are identical to those of FIGS. 7, 8 and 9 of the preceding Example in which the starting material is an n-type silicon plate 1 having a resistivity of 1 Ohm.cm. According to a first modified embodiment, starting from the situation shown in FIG. 9, the parts of the nitride layer 4B and the oxide layer 4A not covered by the pattern (5A, B) are removed and the oxide layer 6 and nitride layer 7 present on the pattern (5A, B) are also removed, during which operation the oxide wall 11 is maintained partly due to its large original thickness of 0.5 micron. In this manner the structure of FIG. 14 is obtained.

A metal layer, for example a 0.2 micron thick platinum layer 15, is then provided over the assembly and a thermal treatment is carried out as in the preceding Examples. Since in this case also the layer 15 is present on either side of the pattern 5A on the silicon surface, the formation of platinum silicide takes place also there by reaction of the layer 15 with the silicon of the substrate 1. As is shown in FIG. 15, the platinum silicide regions 31 and 32 which constitute the source and drain zones of the field effect transistors and form rectifiying metal-semiconductor junctions (Schottky junctions) with the n-type silicon 1, become located higher, due to the already mentioned increase in volume, than the upper surface of the silicon nitride layer 4B which lies only approximately 0.1 micron above the original silicon surface. As a result of this, danger of shortcircuit between the gate electrode 16A (which in this case is fully converted into platinum silicide) and the platinum silicide zones 31 and 32 might occur. However, an important further advantage of the invention becomes obvious since according to the invention such a shortcircuit is avoided by the oxide layer or oxide wall 11 which is present between the gate electrode 16A and the source and drain zones 31 and 32. The device is further completed by removing the non-converted platinum, providing a silicon oxide layer 17, etching contact windows and providing an aluminium metallization 18 (see FIG. 16) as in the preceding Examples.

In the case described the source and drain zones 31 and 32 consist entirely of metal silicide. According to a modified embodiment, however, prior to providing the metal layer 15, p-type source and drain zones 41 and 42 may be formed by indiffusion or implantation of an acceptor, for example boron, as is shown in broken lines in FIGS. 14 to 16, after which the metal silicide 31 and 32 is formed on said zones 41 and 42 and forms a very readily conductive Ohmic contact with the p-type zones 41 and 42. In that case the invention has the great advantage that the series resistance of the source and drain zones is very small so that said zones, if they are in the form of elongate strips, can be contacted without objection at one end via a contact window which is small as compared with the zone.

Although in the preceding Examples platinum was always used as a metal, other silicide-forming metals, for example palladium, cobalt, nickel, titanium, chromium, zirconium, tantalum, tungsten, molybdenum or hafnium may also be used very readily. Of said metals palladium has inter alia the advantage that it can be converted into silicide at low temperature (approximately 200° C) and that both the palladium itself and its silicide can easily be etched (palladium itself, for example, by swelling in hydrogen).

It should furthermore be noted that it is sometimes of advantage to dope the polycrystalline silicon 5 with a donor or acceptor after or during the provision thereof and before the formation of the metal silicide, this in order to reduce the resistivity of the polycrystalline silicon not converted into metal silicide and/or to give the threshold voltage of the field effect transistor a desired value.

The invention is not restricted to the Examples described only by way of illustration but may also be used in all cases in which readily conductive electrode zones should be manufactured in a self-registering manner while using an intermediate conductive layer as a mask insulated from the semi-conductor surface. The ultimately obtained semi-conductor element need not necessarily be a field effect transistor. The semi-conductor substrate may in some cases consist of a semiconductor material other than silicon, for example Ge or a III–V compound for example GaAs, for example, in the Examples described with reference to FIGS. 1 to 13. If desired, other insulating layers and other masking layers may also be used, in so far as these are capable of fulfilling the required functions. In each embodiment, the conductivity types of all zones may furthermore be replaced (simultaneously) by the opposite conductivity type.

What is claimed is:

1. A method of manufacturing a semiconductor device, comprising the steps of:
   (a) providing a semiconductor body comprising a surface,
   (b) providing an electrically insulating layer on said surface,
   (c) providing on said insulating layer a silicon layer which is to be given a desired pattern,
   (d) providing on said silicon layer a masking layer that corresponds to said pattern and provides to said silicon layer local protection against removal of a portion thereof and against oxidation,
   (e) removing those parts of said silicon layer not present below said masking layer,
   (f) providing said semiconductor surface with at least two electrode zones by providing material in said semiconductor body while using at least a part of said silicon pattern as a mask,
   (g) subjecting at least the exposed edges of the resulting silicon pattern to an oxidation treatment,
   (h) selectively removing said masking layer to expose only the upper surface of said silicon pattern,
   (i) providing a metal on said silicon pattern surface,
   (j) subjecting the assembly thus produced to a temperature treatment, whereby at least a part of the silicon pattern is converted into a metal silicide by reaction with the metal, and
   (k) then removing the non-converted said metal.

2. A method as in claim 1, characterized in that said metal is selected from the group consisting essentially of Pt, Pd, Co, Ni, Ti, Cr, Zr, Ta, W, Mo and Hf.

3. A method as in claim 1, wherein said masking layer comprises silicon nitride.

4. A method as in claim 1, wherein said insulating layer comprises a silicon oxide layer and a silicon nitride layer located thereon.

5. A method as in claim 4, wherein the exposed edges of said silicon pattern are oxidized and then the parts of said silicon nitride layer not covered by the oxidized silicon pattern are removed.

6. A method as in claim 1, wherein, prior to providing said metal, said electrode zones are provided by the introduction of a doping material into said semiconductor body while using the silicon pattern as a mask.

7. A method as in claim 1, wherein, before providing electrode zones, there are removed the parts of said insulating layer not present below said silicon pattern.

8. A method as in claim 1, wherein said semiconductor body consists essentially of silicon and wherein, prior to providing said metal, the surface parts of said semiconductor body not covered by said oxidized silicon pattern and destined for said electrode zones are exposed so that during said reaction the silicon regions also adjoining said surface parts are converted into metal silicide regions which constitute at least a part of said electrode zones.

9. A method as in claim 1, wherein said conductor surface and the edges of said silicon pattern are simultaneously oxidized.

10. A method as in claim 1, wherein at least a part of said silicon pattern constitutes a gate electrode of an insulated gate field effect transistor of which said electrode zones are the source and drain zones.

11. A method as in claim 10, wherein, in forming at least a part of the channel region of said transistor, a dopant determining the first conductivity type is provided at only one side of said part of said silicon pattern, after which said source and drain zones are formed by providing a dopant determining the second conductivity type on both sides of said part of said silicon pattern.

12. A method as in claim 1, wherein a dopant is provided in the silicon pattern prior to the provision of said metal.

13. A method as in claim 1, wherein, after removing the nonconverted metal, the pattern converted at least partly into metal silicide is covered with an electrically insulating layer.

14. A semiconductor device manufactured by the method recited in claim 1.

* * * * *

UNITED STATES PATENT OFFICE
CERTIFICATE OF CORRECTION

Patent No. 4,080,719          Dated March 28, 1978

Inventor(s) HERMANUS J.H. WILTING

It is certified that error appears in the above-identified patent and that said Letters Patent are hereby corrected as shown below:

Column 2, line 19, "least" should be --At least-- line 38, "silicide" should be --silicide, used-- line 47, "matter" should be --latter--

Signed and Sealed this

Twenty-sixth Day of September 1978

[SEAL]

Attest:

RUTH C. MASON
Attesting Officer

DONALD W. BANNER
Commissioner of Patents and Trademarks